(12) United States Patent
Iwai et al.

(10) Patent No.: US 12,112,668 B2
(45) Date of Patent: Oct. 8, 2024

(54) FLEXIBLE SUBSTRATE

(71) Applicant: Japan Display Inc., Tokyo (JP)

(72) Inventors: Youhei Iwai, Tokyo (JP); Takumi Sano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 259 days.

(21) Appl. No.: 17/869,805

(22) Filed: Jul. 21, 2022

(65) Prior Publication Data
US 2022/0358866 A1 Nov. 10, 2022

Related U.S. Application Data

(63) Continuation of application No. PCT/JP2020/040959, filed on Oct. 30, 2020.

(30) Foreign Application Priority Data

Jan. 21, 2020 (JP) ................. 2020-007725

(51) Int. Cl.
*H05K 1/02* (2006.01)
*G09G 3/00* (2006.01)

(52) U.S. Cl.
CPC ..... *G09G 3/035* (2020.08); *G09G 2300/0426* (2013.01)

(58) Field of Classification Search
CPC .............................. H05K 1/0283; H05K 1/118
See application file for complete search history.

(56) References Cited

U.S. PATENT DOCUMENTS

2004/0192082 A1 * 9/2004 Wagner .................... H05K 1/11
439/67
2015/0282294 A1 10/2015 Wakuda et al.
2015/0282295 A1 * 10/2015 Matsumoto ............ H05K 1/028
29/850
2015/0282296 A1 10/2015 Ogura et al.
2017/0181276 A1 6/2017 Sawada et al.
2017/0181277 A1 * 6/2017 Tomita .................. H05K 1/038
2020/0267835 A1 8/2020 Okimoto et al.

FOREIGN PATENT DOCUMENTS

| JP | 2015-198101 A | 11/2015 |
|---|---|---|
| JP | 2015-198102 A | 11/2015 |
| JP | 2015-198103 A | 11/2015 |
| JP | 2017-113088 A | 6/2017 |
| JP | 2017-118109 A | 6/2017 |
| WO | 2019/093069 A1 | 5/2019 |

OTHER PUBLICATIONS

Japanese Office Action issued Jan. 30, 2024, in corresponding Japanese Patent Application No. 2020-007725, 6pp.
International Search Report and Written Opinion mailed on Jan. 19, 2021, received for PCT Application PCT/JP2020/040959, filed on Oct. 30, 2020, 8 pages including English Translation.

\* cited by examiner

*Primary Examiner* — Sherman Ng
(74) *Attorney, Agent, or Firm* — XSENSUS LLP

(57) ABSTRACT

According to one embodiment, a flexible substrate includes a first protective member including a first surface, a line portion including a flexible insulating base located on the first surface and a wiring layer disposed on the insulating base and a second protective member covering the line portion, and the first protective member includes a valley portion and a peak portion in the first surface, and the line portion is formed in a wavy shape and located on the valley portion and the peak portion.

4 Claims, 10 Drawing Sheets

FLEXIBLE SUBSTRATE

CROSS-REFERENCE TO RELATED APPLICATIONS

This application is a Continuation Application of PCT Application No. PCT/JP2020/040959, filed Oct. 30, 2020 and based upon and claiming the benefit of priority from Japanese Patent Application No. 2020-007725, filed Jan. 21, 2020, the entire contents of all of which are incorporated herein by reference.

FIELD

Embodiments described herein relate generally to a flexible substrate.

BACKGROUND

In recent years, the use of flexible substrates with flexibility and elasticity has been studied in various fields. For example, such use can be considered that a flexible substrate with electrical elements arrayed in a matrix shape is attached to a curved surface such as of the housing of an electronic device, human body or the like. As electrical elements, various sensors such as touch sensors and temperature sensors, display elements and the like can be applied.

In flexible substrates, it is necessary to take measures to prevent the wiring from being damaged by stress caused by bending and stretching. As such measures, it has been proposed to, for example, provide honeycomb-shaped openings in the base which supports the wiring or to form the wiring to meander (meander shape).

DETAILED DESCRIPTION

Figure 1:
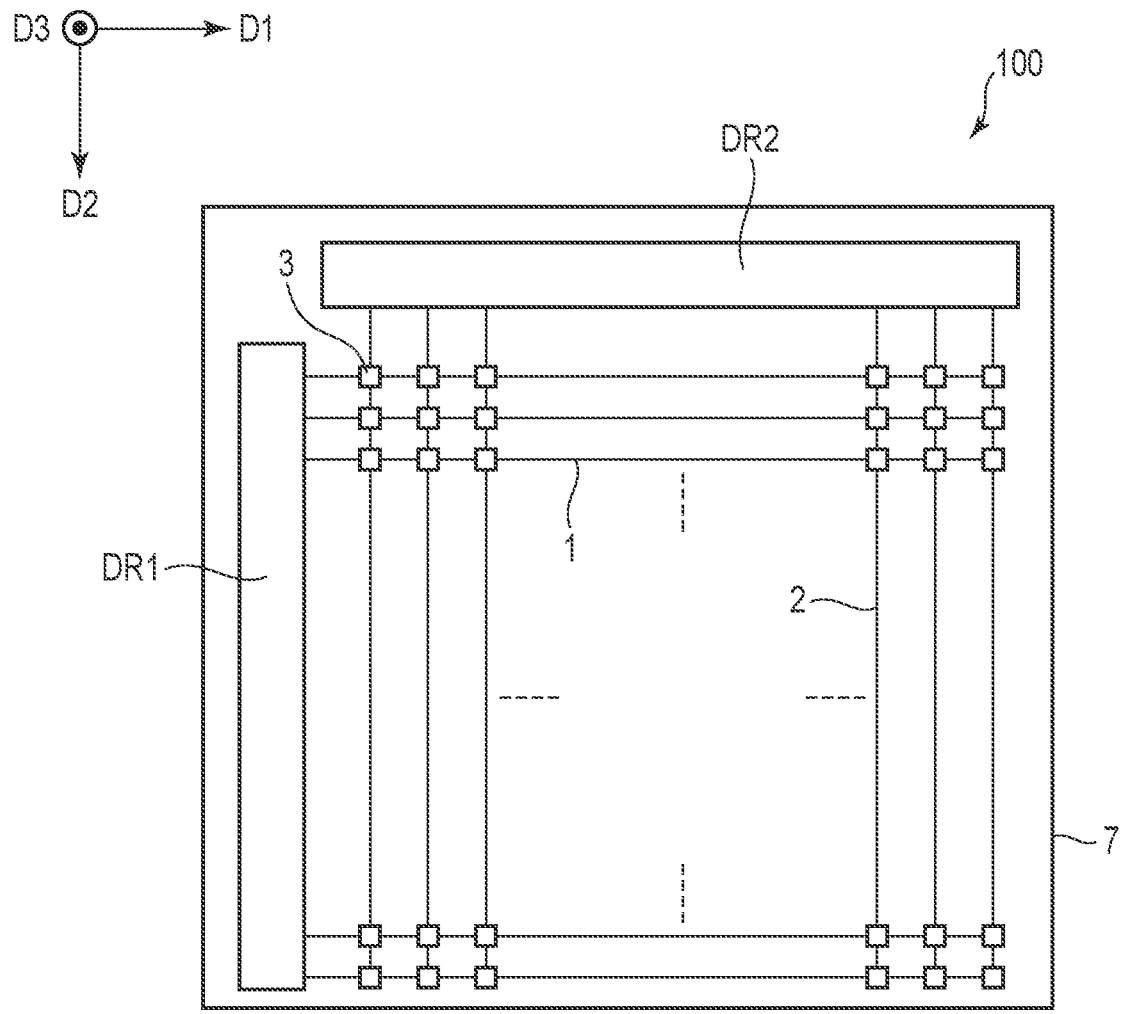
FIG. 1 is a plan view schematically showing a flexible substrate according to the first embodiment.

In general, according to one embodiment, a flexible substrate comprises a first protective member including a first surface, a line portion including a flexible insulating base located on the first surface and a wiring layer disposed on the insulating base and a second protective member covering the line portion, and the first protective member includes a valley portion and a peak portion in the first surface, and the line portion is formed in a wavy shape and located on the valley portion and the peak portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

First, the first embodiment will be described.

FIG. 1 is a plan view schematically showing a flexible substrate 100 according to the first embodiment.

In this embodiment, a first direction D1, a second direction D2 and a third direction D3 are defined as shown in the figure. The first direction D1 and the second direction D2 are parallel to a main surface of the flexible substrate 10 and intersect each other. The third direction D3 is perpendicular to the first direction D1 and the second direction D2, and equivalent to the thickness direction of the flexible substrate 100. The first direction D1 and the second direction D2 intersect normal to each other in this embodiment, but they may intersect at an angle other than normal. In this specification, the direction toward the tip of the arrow indicating the third direction D3 is referred to as "upwards" and the direction from the tip of the arrow to the opposite direction is referred to as "downward". Further, it is assumed that there is an observation position for observing the flexible substrate 100 on the tip side of the arrow indicating the third direction D3, and viewing from this observation position toward a D1-D2 plane defined by the first direction D1 and the second direction D2 is called a planar view.

The flexible substrate 100 includes a plurality of scanning lines 1, a plurality of signal lines 2, a plurality of electrical elements 3, a first protective member 7, a scanning line driver DR1 and a signal line driver DR2. The scanning lines 1, the signal lines 2, the electrical elements 3, the scanning line driver DR1 and the signal line driver DR2 are located on the first protective member 7. The scanning lines 1 each extend along the first direction D1 and aligned along the second direction D2. The scanning lines 1 are each connected to the scanning line driver DR1. The signal lines 2 each extend along the second direction D2 and aligned along the first direction D1. The signal lines 2 are each connected to the signal line driver DR2. The electrical elements 3 are each located at an intersection between each scanning line 1 and each respective signal line 2 and are electrically connected to the scanning lines 1 and the signal lines 2, respectively. Details of the functions of the electrical elements 3 will be described below.

Figure 2:
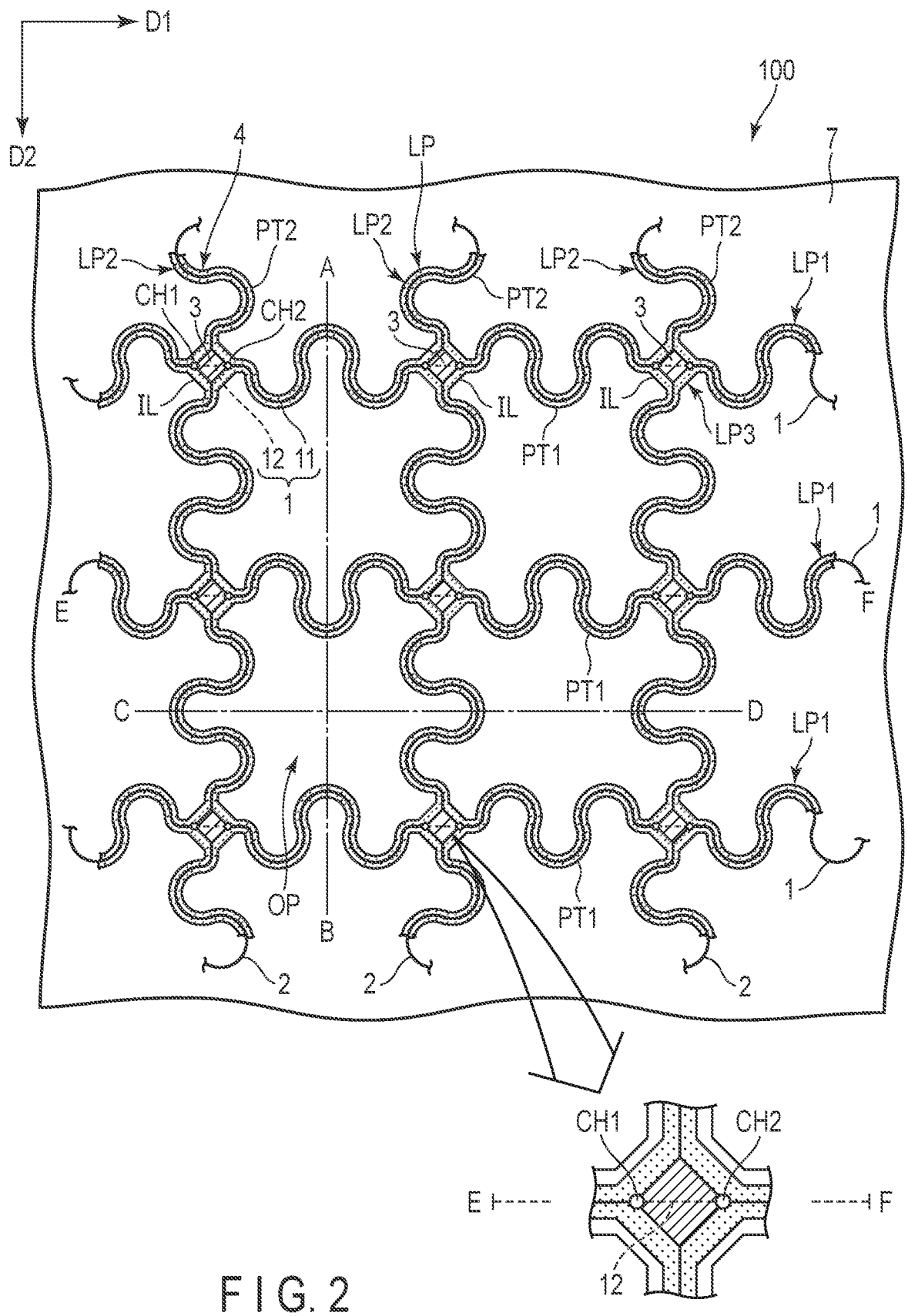
FIG. 2 is a partially enlarged plan view of a flexible substrate shown in FIG. 1.

FIG. 2 is a partially enlarged plan view of the flexible substrate 100 shown in FIG. 1.

Figure 3:
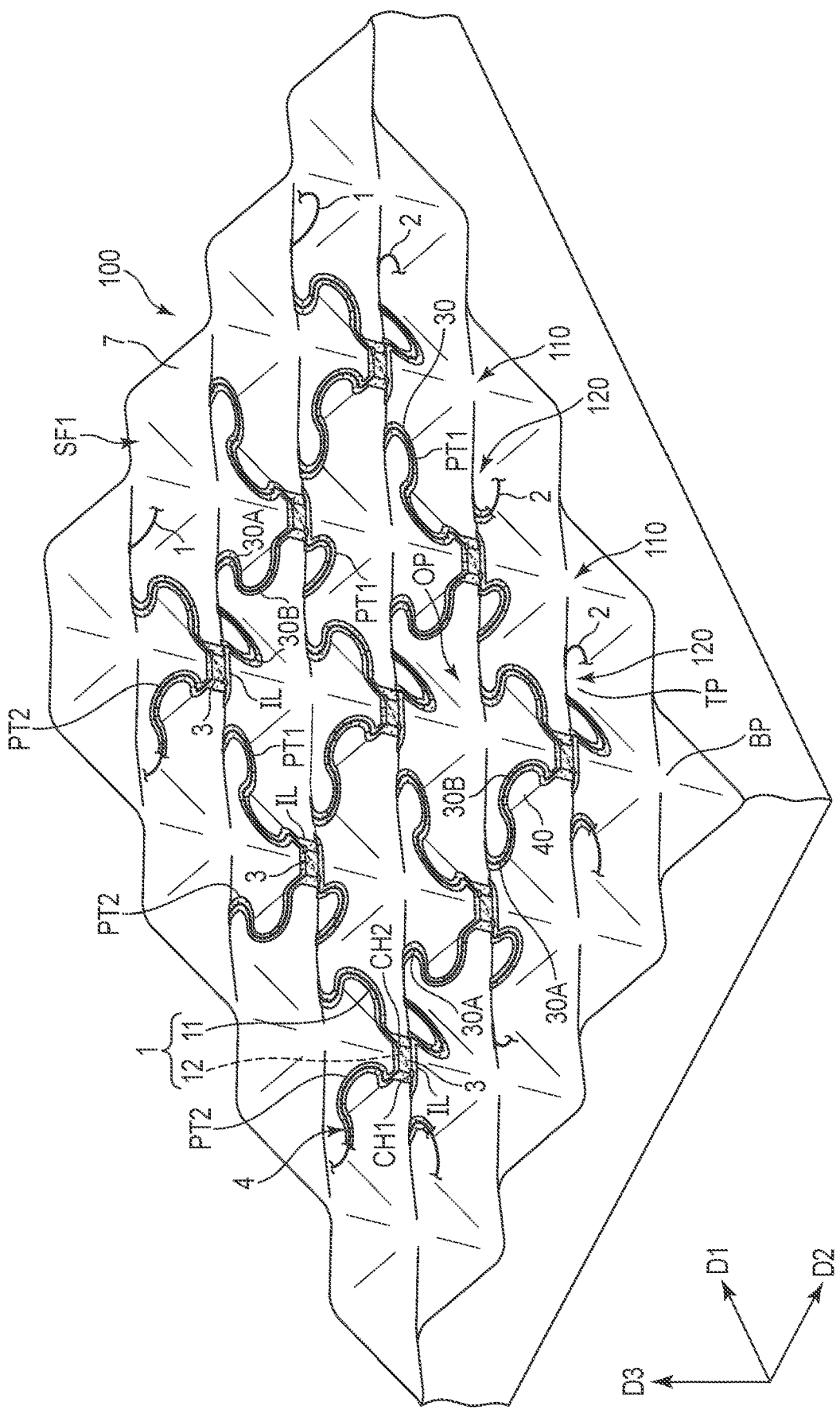
FIG. 3 is a perspective view of the flexible substrate shown in FIG. 2.

The flexible substrate 100 comprises, in addition to those listed above, an insulating base 4 which supports the scanning lines 1 and the signal lines 2. A surface of the first protective member 7, on which the insulating base 4 is disposed, includes a plurality of peak portions 120 and a plurality of valley portions 110, as shown in FIG. 3, but in FIG. 2, the configuration in the D1-D2 plane will be described.

The insulating base 4 includes a plurality of first portions PT1 each extending along the first direction D1 and aligned along the second direction D2, a plurality of second portions PT2 each extending along the second direction D2 and aligned along the first direction D1, and a plurality of island-shaped portions IL provided at respective intersections between the first portions PT1 and the second portions PT2, in plan view. The first portion PT1 and the second portion PT2 are each formed into a wavy shape. The island-shaped portions IL are each connected to the respective first portion PT1 and the respective second portion PT2. The insulating base 4 is flexible and can be formed of polyimide, for example, but it is not limited to this example.

The scanning lines 1 are located on the first portions PT1, respectively and are arranged in a wavy pattern. The signal lines 2 are located on the second portions PT2, respectively and are arranged in a wavy pattern. The scanning lines 1 and the signal lines 2 are examples of wiring lines provided on the flexible substrate 100. The scanning lines 1 and the signal lines 2 can be formed, for example, of a metal material or a transparent conductive material, and may have a single-layer or multi-layer structure. The flexible substrate 100 may comprise, in addition to the scanning lines 1 and the signal lines 2, other types of wiring lines including power lines which supply power to the electrical elements 3.

The scanning lines 1 each includes a first portion 11 indicated by solid line and a second portion 12 indicated by dotted line. The second portions 12 each overlap the electrical elements 3, respectively. The first portion 11 and the second portion 12 are located respectively in layers different from each other and are electrically connected to each other via contact holes CH1 and CH2.

The scanning lines 1 each supply a scanning signal to the respective electrical element 3. When, for example, the electrical element 3 is a sensor-type member, which outputs a signal output, such as a sensor, an output signal from the respective electrical element 3 is supplied to the respective signal line 2. Further, when, for example, the electrical element 3 is of a type such as a light-emitting element or an actuator, which is actuated in response to an input signal, a drive signal is supplied to the signal line 2. A controller, which may include a supply source of scanning signals, a supply source of drive signals, a processor which processes output signals or the like, may be provided on the flexible board 100, or it may be provided on a device connected to the flexible board 100.

The electrical elements 3 are each located on the respective island-shaped portion IL. The electrical element 3 is smaller than the island-shaped portion IL, and in FIG. 2, the entire electrical element 3 is located within the island-shaped portion IL. For example, the electrical elements 3 are each a sensor, a semiconductor device, an actuator or the like. For example, as a sensor, an optical sensor which receives visible light or near-infrared light, a temperature sensor, a pressure sensor, a touch sensor or the like can be applied. For example, as a semiconductor element, a light-emitting element, a light-receiving element, a diode a transistor or the like can be applied. When the electrical elements 3 are light-emitting elements, a flexible display having flexibility and elasticity can be realized. As the light-emitting elements, for example, light-emitting diodes such as mini-LEDs or micro-LEDs or organic electroluminescent elements, having a size of around 100 μm can be applied. When the electrical elements 3 are actuators, for example, piezoelectric elements can be applied. Note that the electrical elements 3 are not limited to those listed as examples here, but other elements having various functions can as well be applied. The electrical elements 3 may be capacitors, resistors or the like. The arrangement positions and shape of the electrical elements 3 are not limited to those of the example illustrated in FIG. 2.

In this embodiment, the insulating base 4, the scanning lines 1, the signal lines 2, a first organic insulating film 5 and a second organic insulating film 6 are collectively referred to as line portions LP. The line portions LP are located on the first protective member 7. The line portions LP include a plurality of wavy first line sections LP1 extending along the first direction D1 and arranged along the second direction D2, a plurality of wavy second line sections LP2 extending along the second direction D2 and arranged along the first direction D1 and island-shaped portions LP3 provided in respective intersections between the first line portions LP1 and the second line portions LP2. The first line portions LP1 each include the respective first portion PT1 and the respective scanning line 1 of the insulating base 4. The second line portions LP2 each include the respective second portion PT2 and the respective signal line 2 of the insulating base 4. Further, the line portions LP form openings OP each surrounded by two adjacent first line sections LP1 and two adjacent second line sections LP2. The openings OP are aligned in a matrix along the first direction D1 and the second direction D2. The electrical elements 3 are located in the island-shaped portions LP3, respectively.

FIG. 3 is a perspective view of the flexible substrate 100 shown in FIG. 2.

The first protective member 7 includes a first surface SF1 on which the insulating base 4 is disposed. The first protective member 7 includes, on the first surface SF1, a plurality of valley portions 110 and a plurality of peak portions 120. The valley portions 110 and the peak portions 120 are alternately arranged along the first direction D1, and also arranged alternately along the second direction D2. The valley portions 110 and the peak portions 120 are formed by ashing the elastic resin which constitutes the first protective member 7 with a mask having stepped thicknesses.

The line portions LP are formed into a wavy shape and are located above the valley portions 110 and the peak portions 120, respectively. Each valley portion 110 includes a bottom portion BP, which is at the lowest level. Each peak portion 120 includes a top portion TP, which is at the highest level. The peak portions 120 each include a slope portion 40 sloped from the respective top portion TP to the bottom portion BP. The line portions LP each include a turnaround point 30 where its respective extending direction is changed. The line portions LP each include a turnaround point (a first turnaround point) 30A located at the top portion TP of the respective peak portion 120 and a turnaround point 30B located in the respective slope portion 40. In the example illustrated, the turnaround point 30A is located between two turnaround points 30B. The electrical elements 3 are each located in the respective valley portion 110.

Figure 4:
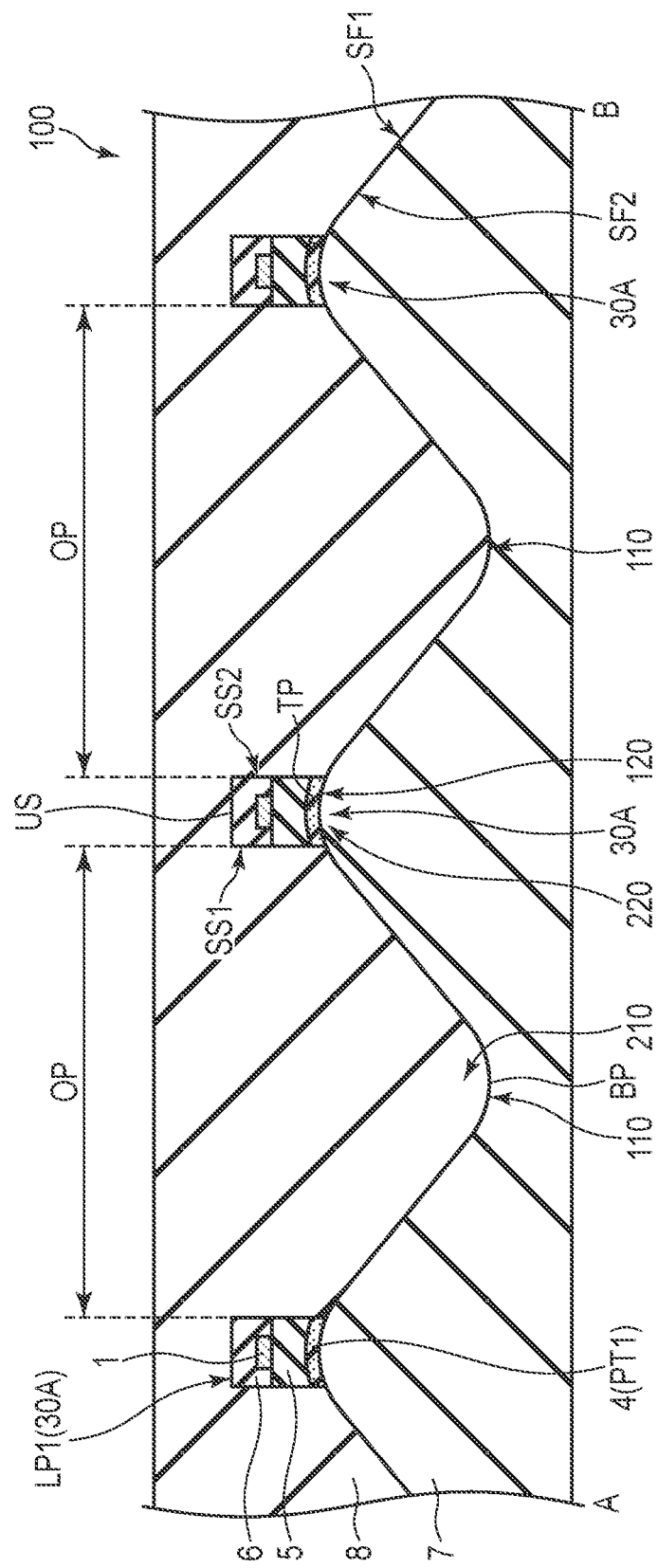
FIG. 4 is a cross-sectional view schematically showing a part of the flexible substrate shown in FIG. 2, taken along line A-B.

FIG. 4 is a cross-sectional view schematically showing a part of the flexible substrate 100 shown in FIG. 2, taken along line A-B.

The flexible substrate 100 includes, in addition to the elements described above, a first organic insulating film 5, a second organic insulating film 6 and a second protective member 8.

The line portions LP1 are located on the first surface SF1 of the first protective member 7. The line portions LP1 each includes a first side surface SS1, a second side surface SS2 on an opposite side to the first side surface SS1, and an upper surface US. The line portions LP1 are each constituted by the insulating base 4, the first organic insulating film 5, the second organic insulating film 6 and the respective scanning line 1.

The first portions PT1 of the insulating base 4 are located on the first surface SF1. The first organic insulating film 5 covers the insulating base 4. The scanning lines 1 are located on the first organic insulating film 5. The second organic insulating film 6 covers the first organic insulating film 5 and the scanning lines 1. Both the first organic insulating film 5 and the second organic insulating film 6 are formed of an organic material.

The second protective member 8 covers the first side surface SS1, the second side surface SS2 and the upper surface US of each of the line portions LP1, and is in contact with the first surface SF1 of the first protective member 7. In other words, the second protective member 8 covers the scanning lines 1, the insulating base 4, the first organic insulating film 5 and the second organic insulating film 6. The second protective member 8 is in contact with the insulating base 4, the first organic insulating film 5 and the second organic insulating film 6 of each line portion LP1. The second protective member 8 is formed of a poly-para-xylylene (poly-p-xylylene:PPX) structure, for example, Parylene (registered trademark).

In the cross-section shown in FIG. 4, the turnaround point 30A is located at the top portion TP of the peak portion 120. The bottom portion BP of each valley portion 110 is located substantially at the center of the respective opening OP. The second protective member 8 includes a second surface SF2 which is in contact with the first protective member 7. The second surface SF2 includes a peak portion 210 at a position opposing the respective valley portion 110 of the first surface SF1 and a valley portion 220 at a position opposing the peak portion 120.

Figure 5:
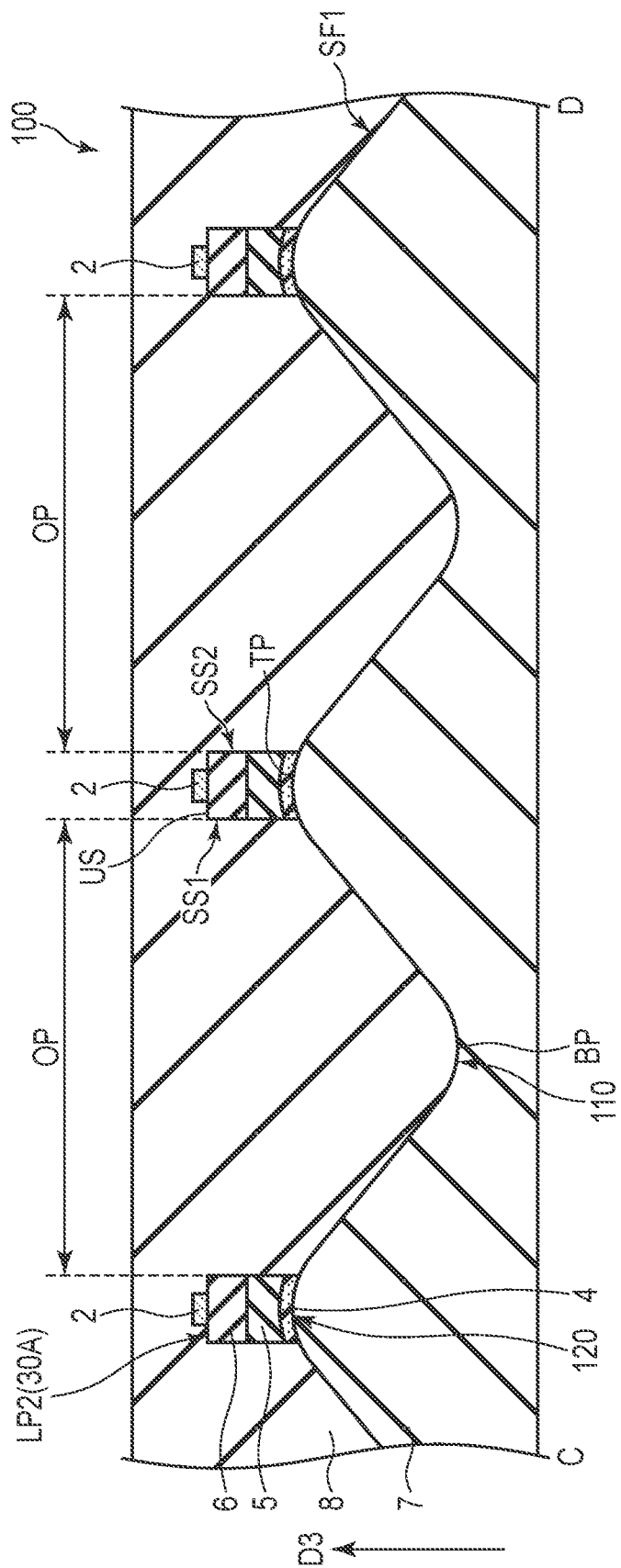
FIG. 5 is a cross-sectional view schematically showing a part of the flexible substrate shown in FIG. 2, taken along line C-D.
Figure 6:
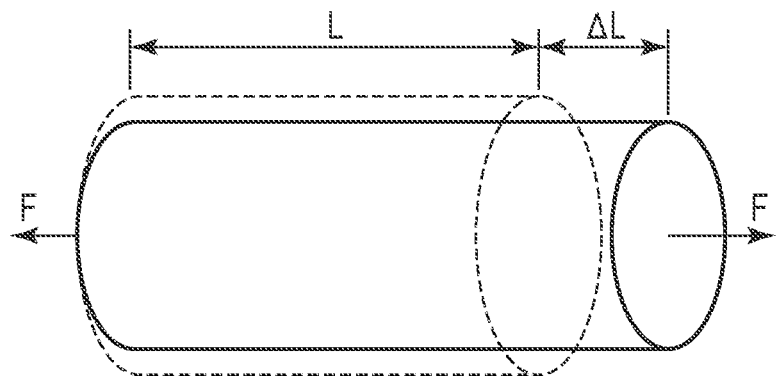
FIG. 6 is a diagram illustrating a definition of strain.

FIG. 5 is a cross-sectional view schematically showing a part of the flexible substrate 100 shown in FIG. 2, taken along line C-D. FIG. 6 illustrates a definition of strain.

The line portions LP2 are located on the first surface SF1. The line portions LP2 each include a first side surface SS1, a second side surface SS2 on an opposite side to the first side surface SS1, and an upper surface US. The line portions LP2 are each constituted by the insulating base 4, the first organic insulating film 5, the second organic insulating film 6 and the respective signal line 2.

The second portions PT2 of the insulating base 4 are located on the first surface SF1. The first organic insulating film 5 covers the insulating base 4. The second organic insulating film 6 covers the first organic insulating film 5. The signal lines 2 are located on the second organic insulating film 6. The second protective member 8 covers the first side surface SS1, the second side surface SS2 and the upper surface US of each line portion LP2, and is in contact with the first protective member 7. In other words, the second protective member 8 covers the insulating base 4, the first organic insulating film 5, the second organic insulating film 6 and the signal lines 2 and is in contact with each of these. In the cross-section shown in FIG. 5, the turnaround point 30A is located at the top portion TP of the respective peak portion 120. The bottom portion BP of the respective valley portion 110 is located substantially at the center of the respective opening OP.

Note in the flexible substrate 100, strain is created in the line portions LP during expansion by tension or bending, which may cause scanning lines 1 and signal lines 2 to break. Here, the definition of strain in this embodiment will be explained. As shown in FIG. 6, when an object having an original length L is stretched by a force F by the amount of elongation ΔL, it can be expressed as: strain ε=elongation/original length=ΔL/L. Here, the strain ε is the maximum main strain.

According to this embodiment, the first protective member 7 includes valley portions 110 and peak portions 120. With this configuration, compared to the case where the first surface SF1 is flat, the line portions LP can be expanded in length along the third direction D3. Thus, the strain generated in the line portions LP when the flexible substrate 100 is expanded can be reduced. As a result, the elongation of the flexible substrate 100 until the scanning lines 1 and the signal lines 2 start cracking can be improved. Further, the occurrence of cracks in the scanning lines 1 and the signal lines 2 can be suppressed. Furthermore, since the strain generated in the wiring lines can be reduced, the first protective member 7 and the second protective member 8 can be made thinner.

Figure 7:
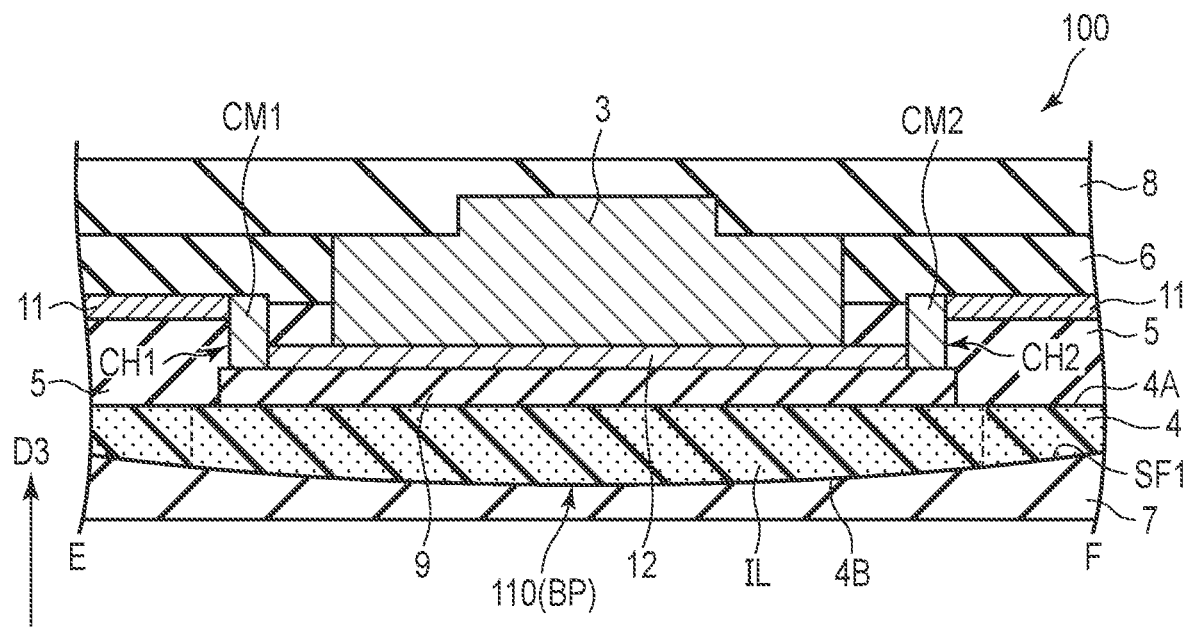
FIG. 7 is a cross-sectional view schematically showing a part of the flexible substrate shown in FIG. 2, taken along line E-F.

FIG. 7 is a cross-sectional view schematically showing a part of the flexible substrate 100 shown in FIG. 2, taken along line E-F. FIG. 7 shows a cross-section including the electrical elements 3.

The electrical elements 3 are each disposed on the respective valley portion 110 formed on the first surface SF1 of the first protective member 7. The insulating base 4 includes an upper surface 4A and a lower surface 4B. The lower surface 4B is curved along the valley portion 110. The upper surface 4A may as well be curved along the lower surface 4B.

Underneath the electrical element 3, an island-shaped portion IL of the insulating base 4 is disposed. With this configuration, the electrical element 3 can be well supported. An inorganic insulating layer 9 (passivation layer) is formed between the electrical element 3 and the island-shaped portion IL. The inorganic insulating layer 9 has an island-shaped pattern which is superimposed on the electrical element 3 in plan view. The first portion 11 of the scanning line 1 is placed on the first organic insulating layer 5 and is covered by the second organic insulating layer 6. The second portion 12 of the scanning line 1 is disposed on the inorganic insulating layer 9 (that is, under the first organic insulating layer 5). The second portion 12 is electrically connected to the electrical element 3. In the example of FIG. 7, the end portions of the second portion 12 are covered by the first organic insulating layer 5.

The contact holes CH1 and CH2 described above are provided in the first organic insulating layer 5 in a region superimposed on the island-shaped portion IL and the inorganic insulating layer 9 in plan view. The first portion 11 of the scanning line 1 is electrically connected to the second portion 12 via connecting members CM1 and CM2, which are disposed in the contact holes CH1 and CH2, respectively. The connecting members CM1 and CM2 may be a part of the first portion 11 or they may be provided separately from the first portion 11.

As described above, according to the configuration shown in FIG. 7, an island-shaped inorganic insulating layer 9 is disposed between the electrical element 3 and the insulating base 4. Since the electrical element 3 and the second portion 12 of the scanning line 1 are protected by the inorganic insulating layer 9, the reliability of the flexible substrate 100 can be improved. On the other hand, inorganic films are more prone to cracking than organic films, and therefore when the wiring lines are formed on the inorganic film, disconnection due to cracking can occur. However, in FIG. 7, the inorganic insulating layer 9 is not provided below the first portion 11 of the scanning line 1. Therefore, disconnection of the scanning line 1 is unlikely to occur. This also the case for the signal lines, which are not shown in the figure. Furthermore, in the case where the inorganic insulating layer 9 is provided over the entire flexible substrate 100, the flexibility and elasticity of the flexible substrate 10 may be degraded; however, when the inorganic insulating layer 9 is formed into an island-shape, such a drawback does not occur.

Moreover, with the structure in which the first portion 11 and the second portion 12 of the scanning lines 1 disposed in different layers are connected by the contact holes CH1 and CH2, the degree of freedom of design in the vicinity of the electrical element 3 can be improved. The contact holes CH1 and CH2 are provided above the inorganic insulating layer 9, and therefore the reliability at the connection position of the first portion 11 and the second portion 12 is also improved.

Figure 8:
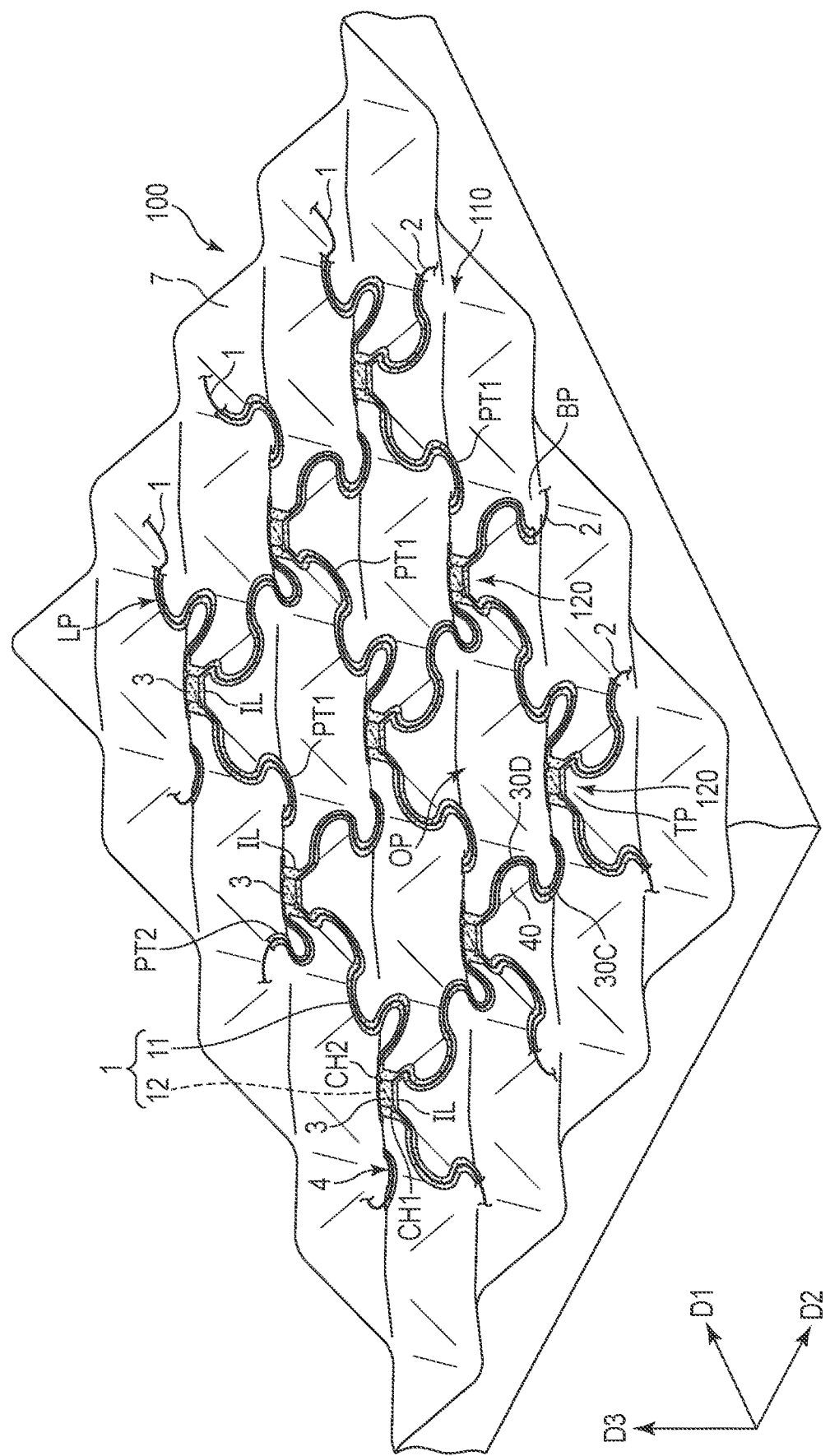
FIG. 8 is a perspective view of a modified example of the first embodiment.

FIG. 8 is a perspective view of a modified example of the first embodiment. The configuration shown in FIG. 8 is different from that of FIG. 3 in that the electrical elements 3 are located respectively at the top portions TP of the peak portions 120.

The line portions LP each includes a turnaround point (a second turnaround point) 30C located at the bottom portion BP of the respective valley portion 110 and a turnaround point 30D located in the respective slope portion 40. In the example illustrated, the turnaround point 30C is located between two adjacent turnaround points 30D.

In such a modified example, advantageous effects similar to those of the first embodiment described above can be obtained.

Second Embodiment

Figure 9:
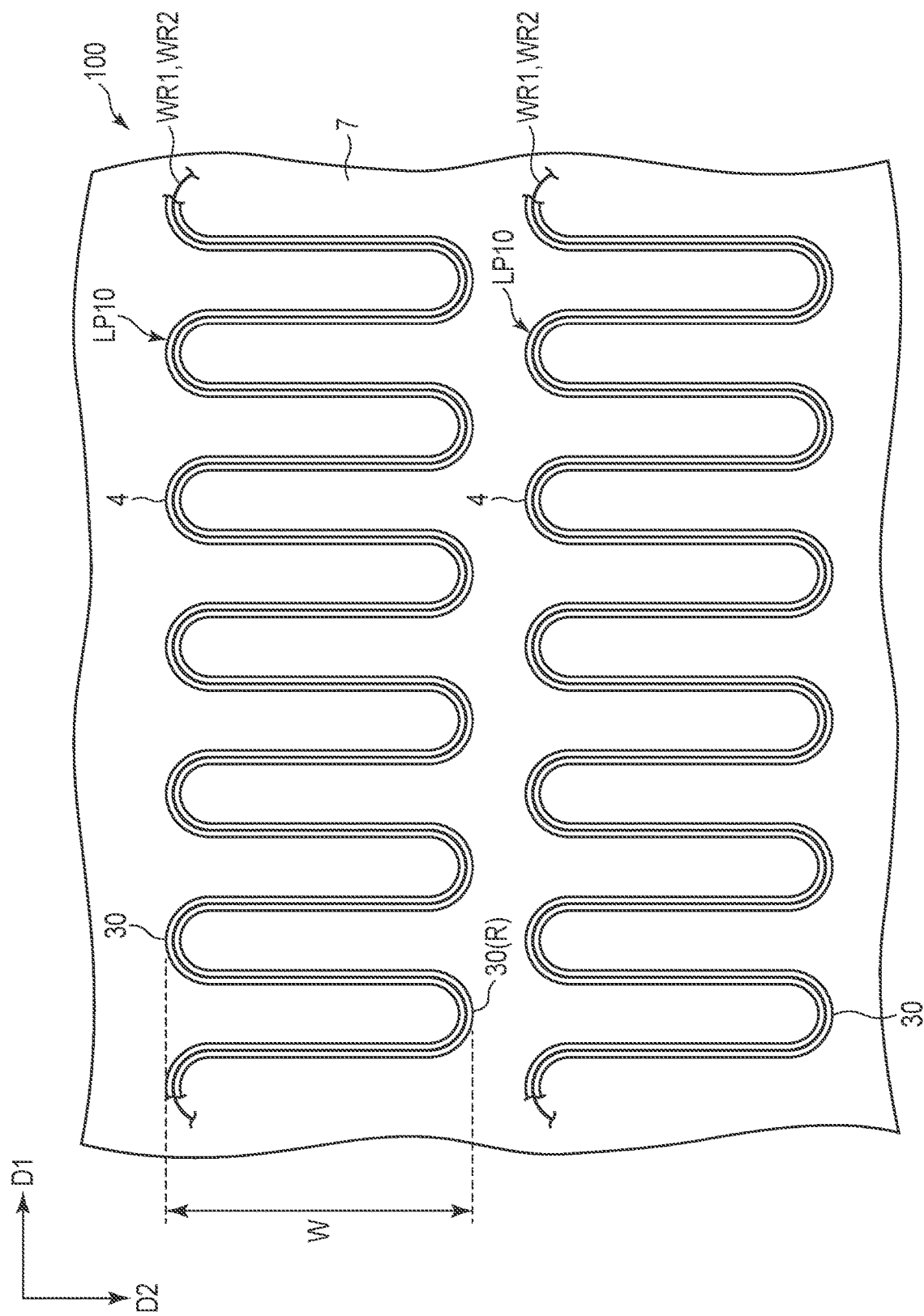
FIG. 9 is a plan view schematically showing a flexible substrate according to the second embodiment.

FIG. 9 is a plan view schematically showing a flexible substrate 100 according to the second embodiment.

The surface of the first protective member 7, on which insulating bases 4 are disposed, includes a plurality of peak portions 120 and a plurality of valley portions 110, but in FIG. 9, the configuration in the D1-D2 plane will be described.

The insulating bases 4 each extend along the first direction D1 and are aligned along the second direction D2 in plan view. The insulating bases 4 are each formed into a wavy shape. The wiring lines WR1 and WR2 are located on the insulating bases 4, respectively, and arranged in a wavy shape. The wiring lines WR1 and WR2 can be formed of, for example, a metal material or a transparent conductive material, and may be of a single-layer structure or a multi-layered structure.

In FIG. 9, the insulating bases 4, the wiring lines WR1 and WR2, the first organic insulating film 5 and the second organic insulating film 2, which will be described later, are collectively referred to as line portions LP10. The line portions LP10 are located on the first protective member 7. The wavy line portions LP10 each extend along the first direction D1 and are aligned along the second direction D2 in plan view. The line portions LP10 each have a width W from a turnaround point 30 to the next turnaround point 30.

The width W is, for example, about 600 μm. The curvature R of the line portions LP10 in the turnaround points 30 is about 75 mm.

Figure 10:
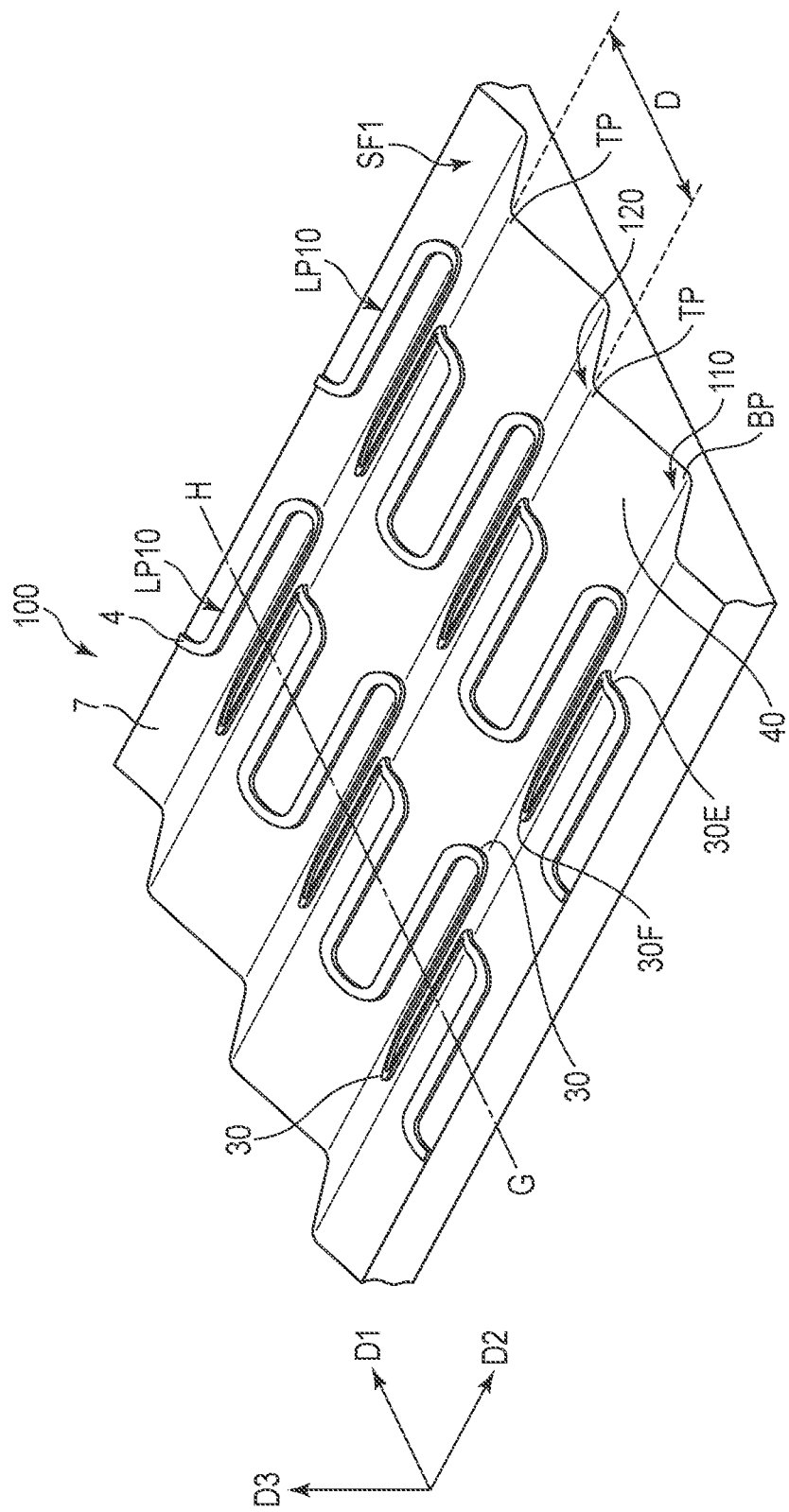
FIG. 10 is a perspective view of the flexible substrate shown in FIG. 9.

FIG. 10 is a perspective view showing the flexible substrate 100 shown in FIG. 9.

The first protective member 7 includes a first surface SF1 on which the insulating bases 4 are disposed. The first protective member 7 includes, in the first surface SF1, a plurality of valley portions 110 and a plurality of peak portions 120. The valley portions 110 and the peak portions 120 extend along the second direction D2 and are alternately arranged along the first direction D1.

The line portions LP10 are formed into a wavy shape and are located on the valley portions 110 and the peak portions 120, respectively. Each valley portion 110 includes a bottom portion BP, which is at the lowest level. Each peak portion 120 includes a top portion TP, which is the highest level. The peak portion 120 includes a slope portion 40 sloped from the top portion TP towards the bottom portion BP. Further, tine portions LP10 each include a turnaround point 30, where its respective extending direction is changed. The line portions LP10 includes a turnaround point 30E located at the top portion TP of the respective peak portion 120 and a turnaround point 30F located at the respective slope portion 40. In the example illustrated, the turnaround points 30E and 30F of the line portions LP10 are alternately arranged. The distance D between two adjacent top portions TP is, for example, about 600 μm. Further, the strain acting on the turnaround point 30F located at each slope portion 40 is reduced by about 25% compared to that of the case where the first surface SF1 is flat.

Figure 11:
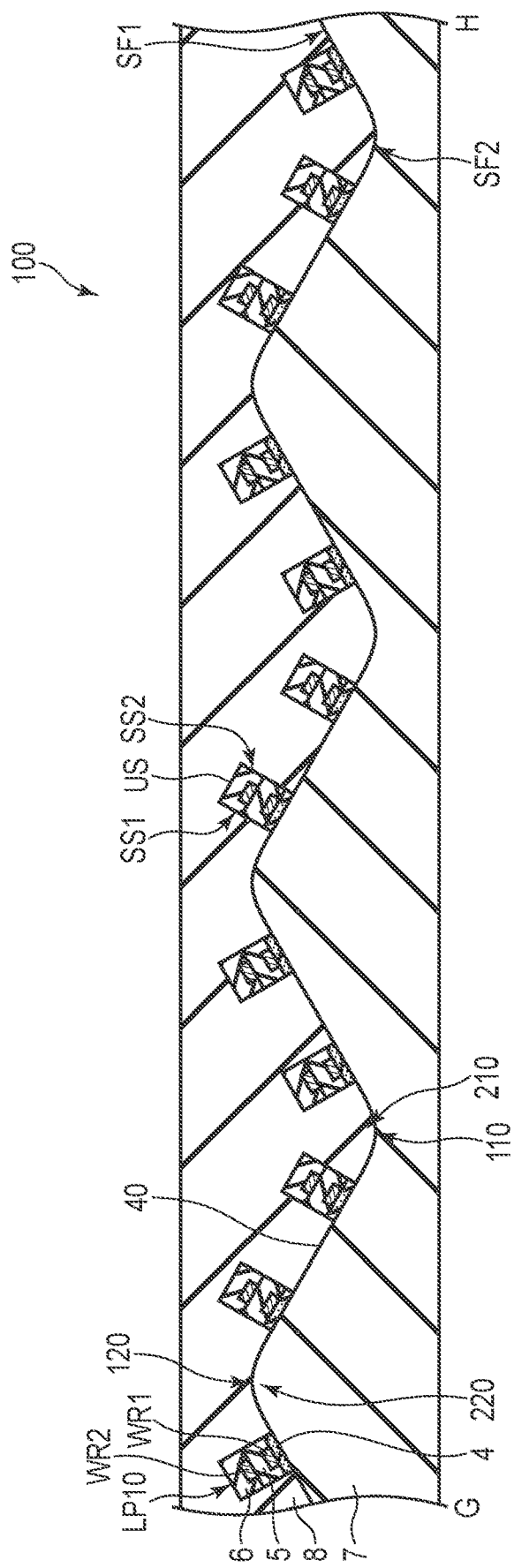
FIG. 11 is a cross-sectional view schematically showing a part of the flexible substrate shown in FIG. 10, taken along line G-H.

FIG. 11 is a cross-section schematically showing a part of the flexible substrate 1 00 shown in FIG. 10, taken along line G-H.

The line portions LP10 are located on the first surface SF1 of the first protective member 7. The line portions LP10 each include a first side surface SS1, a second side surface SS1 on an opposite side to the first side surface SS2 and an upper surface US. The line portions LP10 are constituted by the insulating bases 4, the first organic insulating film 5, the second organic insulating film 6 and the wiring lines WR1 and WR2.

The insulating bases 4 are located on the first surface SF1. The wiring lines WR1 are located on the insulating bases 4, respectively. The first organic insulating film 5 covers the wiring lines WR1 and the insulating bases 4. The wiring lines WR2 are located on the first organic insulating film 5. The second organic insulating film 6 covers the first organic insulating film 5 and the wiring lines WR2.

The second protective member 8 covers the first side surface SS1, the second side surface SS2 and the upper surface US of each line portion LP10, and is in contact with the first surface SF1 of the first protective member 7. In other words, the second protective member 8 covers the insulating bases 4, the first organic insulating film 5, the second organic insulating film 6 and the wiring lines WR1 and WR2. The second protective member 8 is in contact with the insulating bases 4, the first organic insulating film 5 and the second organic insulating film 6 of the line portions LP10.

The first protective member 7 includes slope portions 40 each between the respective valley portion 110 and the respective peak portion 120. In the cross section, two cross sections of each line portion LP10 are located in each slope portion 40. The strain acting on the wiring lines WR1 and WR2 becomes smaller when the thicknesses of the first protective member 7 and the second protective member 8 are reduced, and becomes larger when the thicknesses are increased. The strain acting on the wiring lines WR1 and WR2 becomes is more saturated when the thicknesses of the first protective member 7 and the second protective member 8 are increased. The second protective member 8 includes a second surface SF2 in contact with the first protective member 7. The second surface SF2 includes a peak portion 210 at a position opposing the respective valley portion 110 of the first surface SF1 and a valley portion 220 at a position opposing the respective peak portion 120 of the first surface SF1.

It has been confirmed by simulation that the second embodiment exhibits an advantageous effect of reducing strain on the wiring lines as compared to the case where the first surface SF1 of the first protective member 7 is horizontal. In this case, a single wiring line was used, and in the verification test, the widths of the wiring line were set to 15 μm and 30 μm, and the thickness of the wiring line was set to 10 μm. The thickness of the first protective member 7 and the second protective member 8 combined together was 310 μm.

As described above, according to this embodiment, it is possible to obtain a flexible substrate which can improve the elongation rate and suppress the generation of cracks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
   a first protective member including a first surface;
   a line portion comprising a flexible insulating base located on the first surface and a wiring layer disposed on the insulating base;
   a second protective member covering the line portion; and
   an electrical element, wherein
   the first protective member includes a valley portion and a peak portion in the first surface,
   the line portion is formed in a wavy shape and located on the valley portion and the peak portion,
   the line portion includes a plurality of wavy first line portions extending along a first direction and aligned along a second direction intersecting the first direction, a plurality of wavy second line portions extending along the second direction and aligned along the first direction, and island-shaped portions provided at respective intersections of the first line portions and the second line portions, in plan view,
   the electrical element is located in each of the island-shaped portions, and
   the electrical element is located in the valley portion.

2. The flexible substrate of claim 1, wherein
   the line portion includes a first turnaround point located at a top portion of the peak portion.

3. A flexible substrate comprising:
   a first protective member including a first surface;
   a line portion comprising a flexible insulating base located on the first surface and a wiring layer disposed on the insulating base;
   a second protective member covering the line portion; and
   an electrical element, wherein
   the first protective member includes a valley portion and a peak portion in the first surface,
   the line portion is formed in a wavy shape and located on the valley portion and the peak portion,
   the line portion includes a plurality of wavy first line portions extending along a first direction and aligned along a second direction intersecting the first direction, a plurality of wavy second line portions extending along the second direction and aligned along the first direction, and island-shaped portions provided at respective intersections of the first line portions and the second line portions, in plan view,
   the electrical element is located in each of the island-shaped portions, and
   the electrical element is located in the peak portion.

4. The flexible substrate of claim 3, wherein
   the line portion includes a second turnaround point located at a bottom portion of the valley portion.

\* \* \* \* \*